(12) United States Patent
Tsur et al.

(10) Patent No.: US 12,399,214 B2
(45) Date of Patent: Aug. 26, 2025

(54) SYSTEMS, DEVICES, AND METHODS FOR TESTING INTEGRATED CIRCUITS IN THEIR NATIVE ENVIRONMENTS

(71) Applicant: Sandisk Technologies, Inc., Milpitas, CA (US)

(72) Inventors: Nadav Tsur, Bet Herut (IL); Avi Shani, Petach Tikva (IL); Yair Sommer, Even Yehuda (IL)

(73) Assignee: Sandisk Technologies, Inc., Milpitas, CA (US)

( * ) Notice: Subject to any disclaimer, the term of this patent is extended or adjusted under 35 U.S.C. 154(b) by 447 days.

(21) Appl. No.: 17/654,257

(22) Filed: Mar. 10, 2022

(65) Prior Publication Data
US 2023/0045808 A1 Feb. 16, 2023

Related U.S. Application Data

(60) Provisional application No. 63/232,127, filed on Aug. 11, 2021.

(51) Int. Cl.
*H05K 1/02* (2006.01)
*B23K 1/00* (2006.01)
(Continued)

(52) U.S. Cl.
CPC ........ *G01R 31/2886* (2013.01); *B23K 1/0016* (2013.01); *H05K 1/0268* (2013.01);
(Continued)

(58) Field of Classification Search
CPC .......... G01R 31/2886; G01R 1/0466; B23K 1/0016; B23K 2101/42; H05K 1/0268; H05K 3/3436; H05K 3/363; H05K 2201/09127; H05K 1/0286; H05K 3/4691; H05K 2201/0909; B22F 10/25
See application file for complete search history.

(56) References Cited

U.S. PATENT DOCUMENTS 6,859,054 B1    2/2005   Zhou et al.
7,068,059 B2    6/2006   Hanke et al.
(Continued)

FOREIGN PATENT DOCUMENTS

TW      I244802 B     12/2005
WO    2018089659 A1    5/2018

*Primary Examiner* — Ishwarbhai B Patel
(74) *Attorney, Agent, or Firm* — PATTERSON + SHERIDAN, LLP

(57) ABSTRACT

Disclosed herein are unitary printed circuit boards (PCBs) and methods of using them for testing an integrated circuit (IC). In some embodiments, a unitary PCB comprises a main board portion and a flexible PCB portion, which are configured to be detached from each other at a separation location on the unitary PCB. The main board portion comprises a plurality of pads, and the flexible PCB portion comprises a plurality of through-holes, where a layout of the through-holes corresponds to a layout of the plurality of pads. In some embodiments, a method of testing an IC of a device comprises separating the unitary PCB into a main board portion and a flexible PCB portion, attaching the IC to the main board portion, soldering the main board portion to a platform PCB of the device, and attaching the flexible PCB portion to the main board portion.

11 Claims, 19 Drawing Sheets

(51) Int. Cl.
*G01R 31/28* (2006.01)
*H05K 1/11* (2006.01)
*H05K 1/18* (2006.01)
*H05K 3/34* (2006.01)
*H05K 3/36* (2006.01)
*B23K 101/42* (2006.01)
*H05K 1/03* (2006.01)
*H05K 1/14* (2006.01)

(52) U.S. Cl.
CPC ........... *H05K 3/3436* (2013.01); *H05K 3/363* (2013.01); *B23K 2101/42* (2018.08); *H05K 1/0393* (2013.01); *H05K 1/111* (2013.01); *H05K 1/115* (2013.01); *H05K 1/14* (2013.01); *H05K 1/18* (2013.01); *H05K 2201/09127* (2013.01)

(56) References Cited

U.S. PATENT DOCUMENTS

| | | | |
|---|---|---|---|
| 10,269,696 | B2 | 4/2019 | Vreman et al. |
| 2006/0267615 | A1* | 11/2006 | Grilletto .............. G01R 1/0433 |
| | | | 324/756.02 |
| 2018/0164343 | A1* | 6/2018 | Wang .................... H05K 1/0268 |
| 2019/0122974 | A1 | 4/2019 | Goh et al. |
| 2020/0375028 | A1* | 11/2020 | Lee ........................ H05K 1/115 |
| 2021/0008364 | A1* | 1/2021 | Chen .................... H05K 3/3436 |

* cited by examiner

SYSTEMS, DEVICES, AND METHODS FOR TESTING INTEGRATED CIRCUITS IN THEIR NATIVE ENVIRONMENTS

CROSS-REFERENCE TO RELATED APPLICATIONS

This application claims the benefit of, and hereby incorporates by reference in its entirety for all purposes the contents of, U.S. Provisional Application No. 63/232,127, filed on Aug. 11, 2021 and entitled "Systems, Devices, and Methods for Testing Integrated Circuits In Their Native Environments".

BACKGROUND

An integrated circuit (IC) is typically housed in a package to allow it to be installed in a printed circuit board (PCB). One type of IC package is known as a ball grid array (BGA). As implied by the name, the connection points (or pins) of a BGA package are arranged in a grid of balls on the bottom of the IC. The IC is installed in a PCB by soldering the balls to contact points on the PCB, after which the balls are, generally speaking, no longer visible or accessible.

It is desirable to be able to test the functionality and operation of an IC after it has been installed in a PCB, and after the PCB has been incorporated into a product, device, or system.

One way to test ICs in BGA packages after they have been installed in a product is by using a socket or a dedicated adapter. The BGA IC is removed from the PCB and inserted into a socket or dedicated adapter for testing. A drawback of this approach is that dedicated adapters and sockets are expensive. Moreover, the procedure to use a socket or adapter can be tedious and labor-intensive because hand-soldering may be required. The adapter and/or soldering may also create signal integrity issues. An additional drawback is that because the IC must be disassembled from the PCB, the IC cannot be inspected in its "natural" embedded environment. Even if the socket or adapter can be incorporated into the PCB, its size may make testing of the PCB in its native environment difficult or impossible. For example, some products will not operate at all or in a meaningful way without their covers installed, and the inclusion of a socket or adapter for testing ICs in such products may prevent installation of the cover.

Accordingly, there is a need for a simpler, less time-consuming, and less expensive way to connect to and test installed ICs, such as those that have BGA packages. A goal is to provide direct access to the IC in its natural environment (e.g., on the PCB) without the use of complicated soldering procedures and without creating signal integrity issues.

SUMMARY

This summary represents non-limiting embodiments of the disclosure.

In some aspects, the techniques described herein relate to a unitary printed circuit board (PCB) for testing an integrated circuit (IC), the unitary PCB including: a main board portion on a first side of a separation line; and a flexible PCB portion on a second side of the separation line, wherein: the main board portion and the flexible PCB portion are configured to be detached from each other at the separation line, the main board portion includes a first plurality of pads, and the flexible PCB portion includes a plurality of through-holes, and wherein a layout of the through-holes of the flexible PCB portion corresponds to a layout of the first plurality of pads of the main board portion.

In some aspects, the techniques described herein relate to a unitary PCB, wherein the main board portion further includes a plurality of contact points corresponding to a plurality of pins of the IC and configured to be coupled to the IC.

In some aspects, the techniques described herein relate to a unitary PCB, wherein the main board portion further includes a plurality of transfer lines, and wherein at least subset of the plurality of contact points is coupled to the plurality of transfer lines for transferring signals from the IC.

In some aspects, the techniques described herein relate to a method of using the above-described unitary PCB, the method including: separating the main board portion from the flexible PCB portion at the separation line; soldering at least a portion of the plurality of pads of the IC to at least a portion of the plurality of contact points; aligning the through-holes of the flexible PCB portion with the first plurality of pads of the main board portion; and reattaching the flexible PCB portion to the main board portion by soldering at least a portion of the through-holes of the flexible PCB portion to a corresponding at least a portion of the first plurality of pads.

In some aspects, the techniques described herein relate to a unitary PCB, wherein a thickness of the main board portion is less than approximately 0.5 mm.

In some aspects, the techniques described herein relate to a unitary PCB, wherein the main board portion further includes a plurality of contact points corresponding to a ball grid array of the IC and configured to be soldered to the IC.

In some aspects, the techniques described herein relate to a unitary PCB, wherein the main board portion further includes a connector configured to couple the IC to test equipment.

In some aspects, the techniques described herein relate to a unitary PCB, wherein the through holes of the flexible PCB portion are situated on a first end of the flexible PCB portion, and wherein a second end of the flexible PCB portion includes at least one connector.

In some aspects, the techniques described herein relate to a unitary PCB, wherein at least one connector is configured to allow the flexible PCB portion to be connected to test equipment.

In some aspects, the techniques described herein relate to a unitary PCB, wherein the main board portion includes a universal flash storage (UFS) connector and/or a VSF connector.

In some aspects, the techniques described herein relate to a method of using the unitary PCB described above, the method including: separating the main board portion from the flexible PCB portion at the separation line; soldering the IC to the main board portion; aligning the through-holes of the flexible PCB portion with the first plurality of pads of the main board portion; and reattaching the flexible PCB portion to the main board portion by soldering at least a portion of the through-holes of the flexible PCB portion to a corresponding at least a portion of the first plurality of pads.

In some aspects, the techniques described herein relate to a unitary PCB, wherein a size of the main board portion is approximately 20 mm by approximately 13 mm.

In some aspects, the techniques described herein relate to a method of testing an integrated circuit (IC) of a device, the method including: separating a unitary printed circuit board (PCB) into a main board portion and a flexible PCB portion; attaching the IC to the main board portion; soldering the main board portion to a platform PCB of the device; and attaching the flexible PCB portion to the main board portion.

In some aspects, the techniques described herein relate to a method, wherein the IC includes a ball grid array (BGA) package, and wherein attaching the IC to the main board portion includes soldering at least one ball of the BGA package to the main board portion.

In some aspects, the techniques described herein relate to a method, wherein attaching the IC to the main board portion includes re-balling the IC to the main board portion using a mask.

In some aspects, the techniques described herein relate to a method, wherein separating the unitary flexible PCB circuit into the main board portion and the flexible PCB portion includes cutting the unitary flexible PCB circuit into the main board portion and the flexible PCB portion at a separation point.

In some aspects, the techniques described herein relate to a method, wherein the unitary flexible PCB circuit includes a marking identifying the separation point.

In some aspects, the techniques described herein relate to a method, wherein the main board portion includes a universal flash storage (UFS) connector, and further including connecting the main board portion to a UFS analyzer device via the UFS connector.

In some aspects, the techniques described herein relate to a method, wherein the main board portion includes a plurality of pads and the flexible PCB portion includes a corresponding plurality of through-holes, and wherein attaching the flexible PCB portion to the main board portion includes soldering the plurality of through-holes to the corresponding plurality of pads.

In some aspects, the techniques described herein relate to a method, further including: after attaching the IC to the main board portion, soldering the main board portion to a platform PCB of the device, and attaching the flexible PCB portion to the main board portion, installing a cover of the device, thereby enclosing at least the main board and at least a portion of the flexible PCB portion within the device.

BRIEF DESCRIPTION OF THE DRAWINGS

Objects, features, and advantages of the disclosure will be readily apparent from the following description of certain embodiments taken in conjunction with the accompanying drawings in which.

Figure 1A:
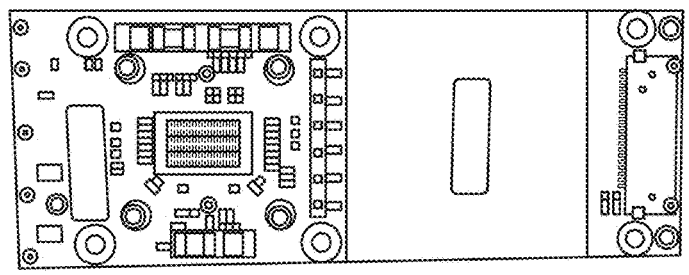
FIGS. 1A and 1B show examples of dedicated adapters used to test ICs.
Figure 1A:
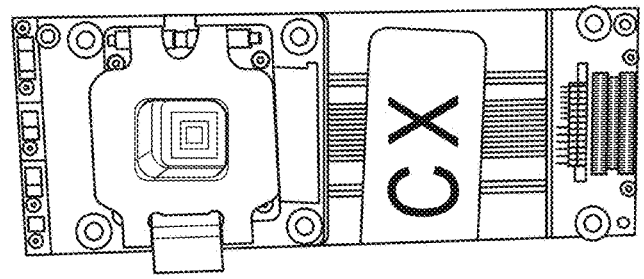
Figure 1A:
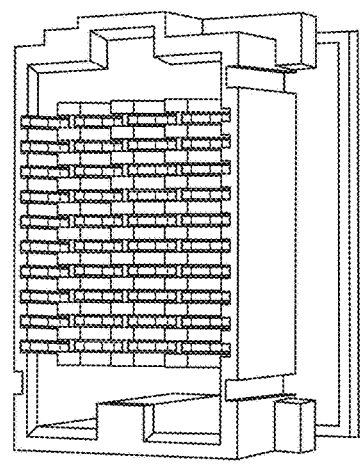
Figure 1A:
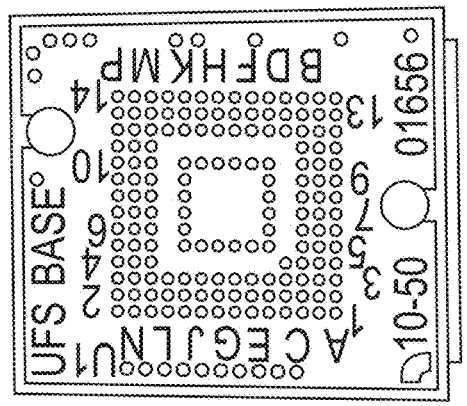

To facilitate understanding, identical reference numerals have been used, where possible, to designate identical elements that are common to the figures. It is contemplated that elements disclosed in one embodiment may be beneficially utilized in other embodiments without specific recitation. Moreover, the description of an element in the context of one drawing is applicable to other drawings illustrating that element.

DETAILED DESCRIPTION

Figure 1B:
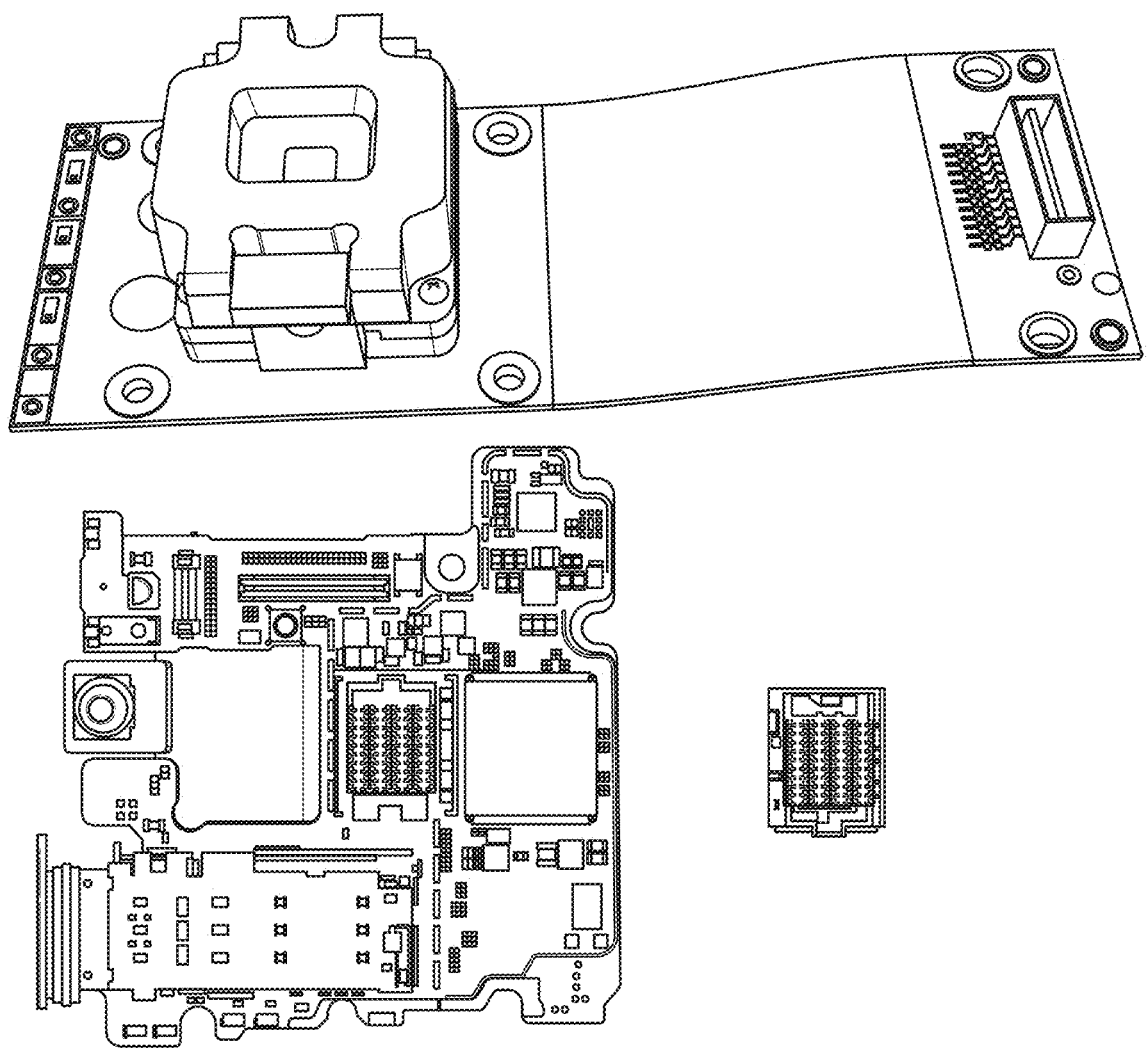
Figure 1C:
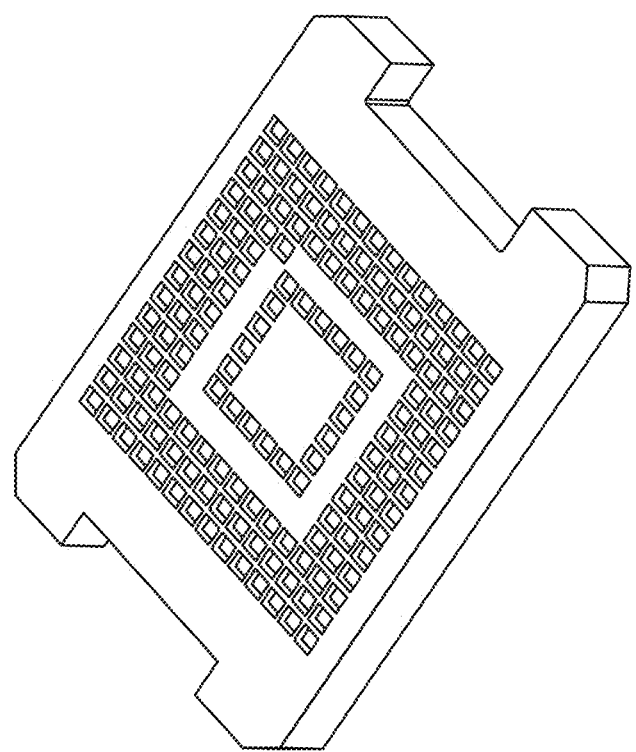
FIG. 1C shows an example of a gripper socket used to test ICs.
Figure 1C:
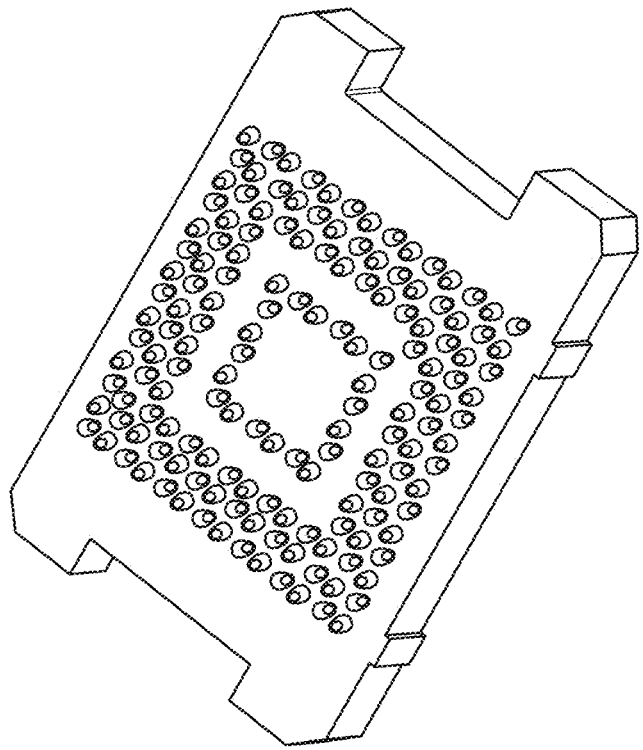

It is desirable to be able to test the functionality and operation of ICs after they have been installed in PCBs. One way to connect to ICs in BGA packages (e.g., for testing after they have been installed) is by removing the IC from the PCB and using a socket or a dedicated adapter to test it. FIGS. 1A and 1B show examples of dedicated adapters, and FIG. 1C shows an example of a gripper socket. A drawback of using dedicated adapters or sockets is that they are typically expensive. For example, a dedicated adapter may cost $400 or more per unit, and a gripper socket may cost $600 or more per unit.

Even if the purchase cost is not prohibitive, the procedure to use a socket or adapter can be tedious and labor-intensive. For example, in one procedure, the IC to be inspected is disconnected (removed) from the PCB, and an adapter "base" is soldered onto the PCB in place of the IC. The IC is then inserted into a socket, which is inserted into the base. The socket can then be connected to external testing or validation tools so that direct access to the IC is possible.

Figure 2:
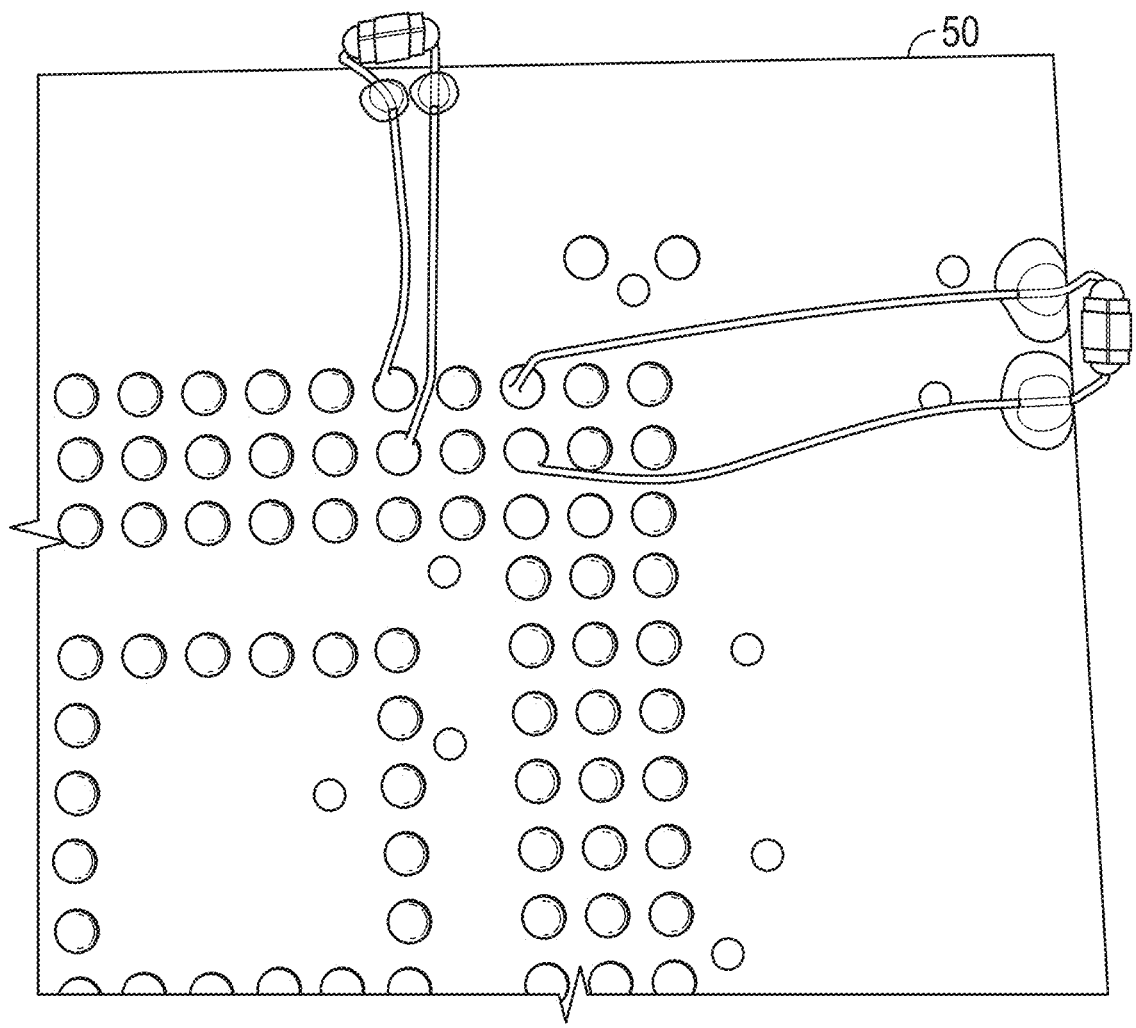
FIG. 2 illustrates separate connecting metal wires that have been hand-soldered to each relevant ball of an IC.

An alternative, less common approach is ball-by-ball soldering by hand after the BGA IC has been removed from the PCB. In this approach, an experienced technician hand-solders separate connecting metal wires to each relevant ball of the IC. FIG. 2 illustrates separate connecting metal wires that have been hand-soldered to each relevant ball of an IC 50. In addition to being tedious, difficult, and requiring a certain level of skill, the hand-soldering approach suffers from other drawbacks, such as stability issues related to the wires.

Both the socket/adapter and hand-soldering approaches require disassembly of the IC 50 from the PCB, which means the IC 50 cannot be inspected in its "natural" embedded environment. Thus, for example, if an IC 50 in a customer's product is suspected to have failed, it can be inspected only after being removed from its internal interfaces inside the product.

There are significant disadvantages to both using a socket/adapter and hand-soldering to test an IC 50 that has been removed from a PCB. First, both approaches are complicated and require a certain level of skill to perform. As explained above, hand-soldering in the ball-by-ball approach is difficult, and the adapter/socket approach is also challenging because the IC 50 must be removed from the PCB and the base soldered to the PCB in its place. Once the socket or adapter is in place, and the IC 50 has been inserted, it might not be possible to install a product's cover, which means testing the IC 50 under ordinary operating conditions (e.g., in temperatures that occur when the cover is on) may be impossible.

Another disadvantage is that the above-described approaches add external constraints and noise sources (such as, for example, capacitance added by the adapter/socket, noise added by connection hardware, variability of hand wiring in the ball-by-ball hand-soldering approach, etc.). In the adapter/socket approach, the soldering of the adapter or socket is complicated and may cause signal integrity (SI) issues (e.g., interference on the lines). In addition, as explained above, sockets and adapters are expensive, as are the skilled technicians who perform the soldering (in either approach).

It would be advantageous to find a simpler, less time-consuming, and less expensive way to be able to connect to and test installed ICs, such as those that have BGA packages. A goal is to provide direct access to the IC in its natural environment (e.g., on the PCB) without the use of complicated soldering procedures and without adding SI issues through interfaces.

Disclosed herein are embodiments of flexible PCB circuits that can be inserted between and soldered to the product PCB and the IC 50, thereby allowing for testing of the IC 50 in its native environment. Certain embodiments allow convenient connection to BGA packages for debug, SI measurements, etc. In some embodiments, a single, unitary PCB is produced, thereby reducing manufacturing costs. As used herein, the word "unitary" means an undivided whole. In other words, a single, one-piece PCB is manufactured. That single, one-piece PCB (a unitary PCB) may subsequently be separated into two portions.

In some embodiments, at least a part of the unitary PCB is flexible. In other words, the unitary PCB may be or may comprise a flexible PCB (sometimes referred to as "flex cable"), or it may be or may comprise a rigid-flex PCB (a PCB that includes both flexible and rigid portions). The unitary PCB is designed so that it can be physically separated into two parts. The separation point may be, for example, a line, notch, or other marking on the unitary PCB, or the separation point may be any of a variety of locations within a region of the unitary PCB.

A first portion of the two portions into which the unitary PCB can be or is separated can be referred to as a main board, which can be soldered under an embedded component (e.g., an IC 50 to be tested). A second portion of the two portions into which the unitary PCB can be or is separated is a connector portion, which can be connected directly to the main board portion by a simple soldering process, thereby mitigating any need for an additional connector. The main board may also (or alternatively) provide connection points for one or more types of external connector.

Some embodiments disclosed herein allow direct connection to the metal ball interface of a BGA IC 50 by insertion of the testing circuitry in the main board between the product PCB and the IC 50 under test. The result is a small or negligible increase in the height of the IC 50 following the insertion. The flexible PCB portion of the unitary PCB can then be attached to the main board. Test equipment can then be attached to the flexible PCB portion to allow the IC 50 to be tested and/or observed. The disclosed unitary PCBs allow BGA ICs in a variety of products, such as, for example, mobile phones, tablets, laptops, and virtual reality headsets, to be tested and/or observed in their original native environment and native form factor. Because the main board of the unitary PCB is thin, embodiments disclosed herein do not cause a significant increase in the height of the platform (or product) PCB in the vicinity of the suspect IC 50 (as the adapter/socket approach typically would), which is an advantage for testing ICs in products that have covers and do not operate properly (or at all) without their covers being in place.

Unlike other methods to connect to the metal ball array of a BGA IC 50 for testing, the disclosed embodiments do not require complicated add-on adapter hardware that can cause SI issues, as well as increase cost, nor do they require a complicated, potentially-unstable ball-by-ball soldering by hand. Instead, embodiments provide for parallel soldering that allows a simple direct connection to metal-ball interface of an IC 50. As explained further below, the main board portion of the unitary PCB can be placed on the metal-ball interface of the IC 50, and a simple "tick-soldering" can be performed for all of the relevant balls. Thus, the unitary PCB can be produced in accordance with the metal-ball interface structure (e.g., so that the main board has appropriate connections and interfacing for the IC 50 to be tested), and it can be used after a minimal-effort parallel soldering of all relevant balls of the IC 50 in one operation that is much simpler than alternative methods (e.g., using an adapter/socket or hand-soldering ball-by-ball).

In some embodiments, a single, unitary PCB circuit is manufactured. The unitary PCB may be, for example, a flexible PCB or a rigid-flex PCB. This single, unitary PCB circuit can be physically separated into the main board and flexible PCB portions (e.g., with scissors) in-house when testing or observation of an IC is desired. For example, the single, unitary PCB circuit may have a marker on it identifying a separation point or a region of candidate (or available) separation points. After separating the unitary PCB circuit into two circuits (e.g., detaching the main board from the flexible PCB), a first portion of the unitary PCB (the main board portion) can be situated between the product PCB and the IC under test, and a second portion of the unitary PCB can be used to interface with the first portion of the PCB (e.g., after soldering the second portion to the first portion).

Figure 3:
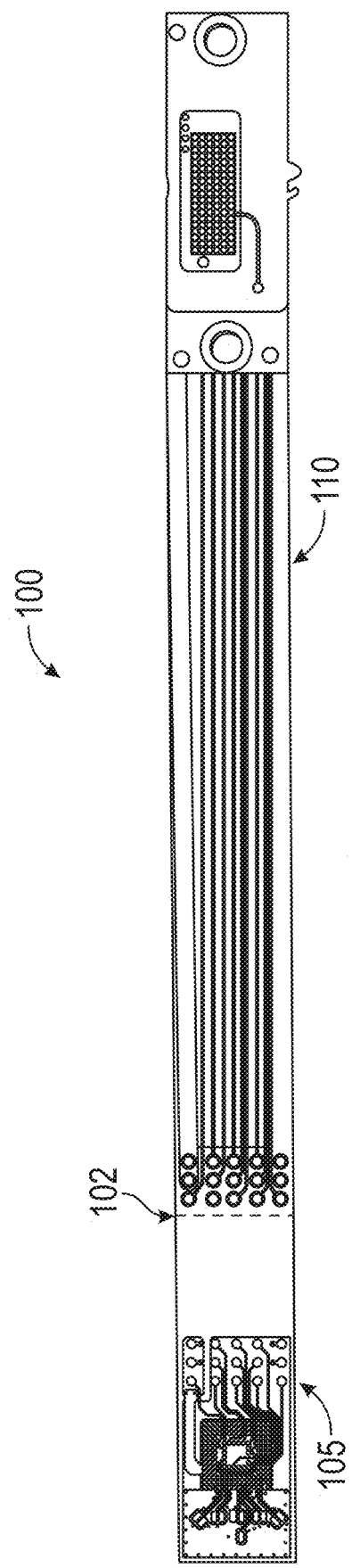
FIG. 3 shows an example embodiment of a single flexible PCB circuit in accordance with some embodiments.

FIG. 3 shows an example embodiment of a unitary PCB 100 in accordance with some embodiments. As shown in FIG. 3, the unitary PCB 100 has not yet been separated into two portions (the main board 105 and the flexible PCB 110), although the main board 105 and the flexible PCB 110 are identified in FIG. 3. The example unitary PCB 100 shown in FIG. 3 includes a separation point 102 at which the unitary PCB 100 should be cut to separate it into the main board 105 and the flexible PCB 110. The main board 105 is on a first side of the separation point 102 (the left side of FIG. 3), and the flexible PCB 110 is on a second side of the separation point 102 (the right side of FIG. 3). The separation point 102 may be located in a region of the unitary PCB 100 in which the unitary PCB 100 may be cut to create two portions. In other words, the separation point 102 may be any one of a variety of possible locations in a region or area of the unitary PCB 100. The separation point 102 may be marked or otherwise made apparent on the unitary PCB 100, or it may not be marked (e.g., its location may be implied or inferred by inspection, such as by noting an absence of circuitry in a region of the unitary PCB 100). Regardless of whether its location is marked on the unitary PCB 100, the separation point 102 is the location at which the main board 105 and the flexible PCB 110 are configured to be (or eventually are) detached from each other.

Figure 4A:
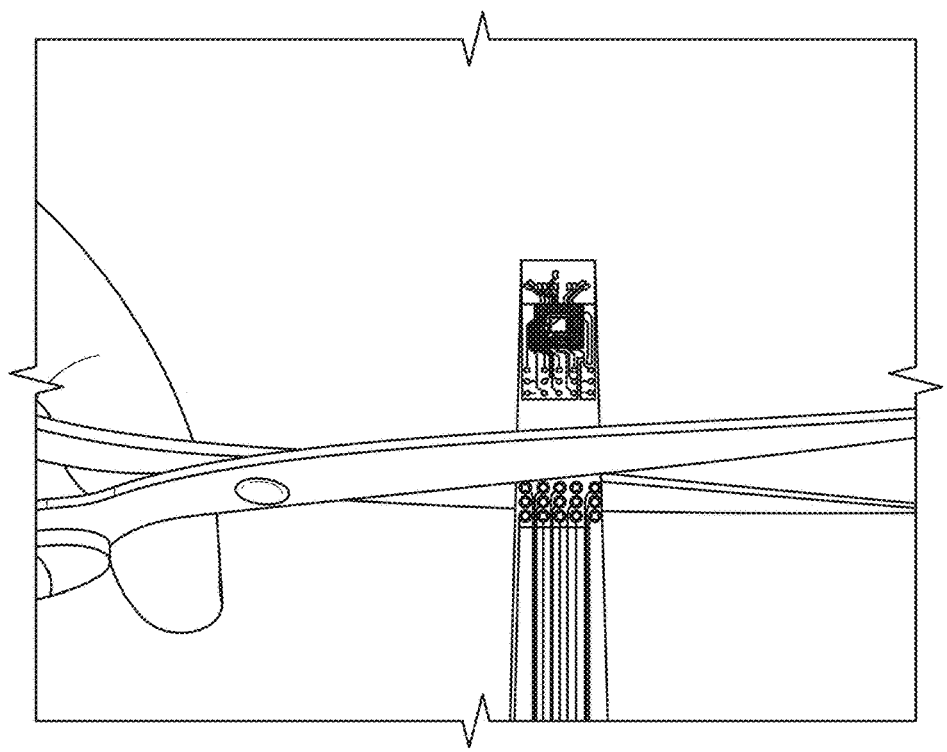
FIG. 4A shows the example embodiment of a single flexible PCB circuit before being cut into two pieces using scissors in accordance with some embodiments.

FIG. 4A shows the example embodiment of the unitary PCB 100 of FIG. 3 when it is about to be separated into the main board 105 and the flexible PCB 110 using scissors in accordance with some embodiments. It is to be appreciated that a cutting implement other than scissors could be used. Any suitable technique to separate the main board 105 from the flexible PCB 110 could be used.

Figure 4B:
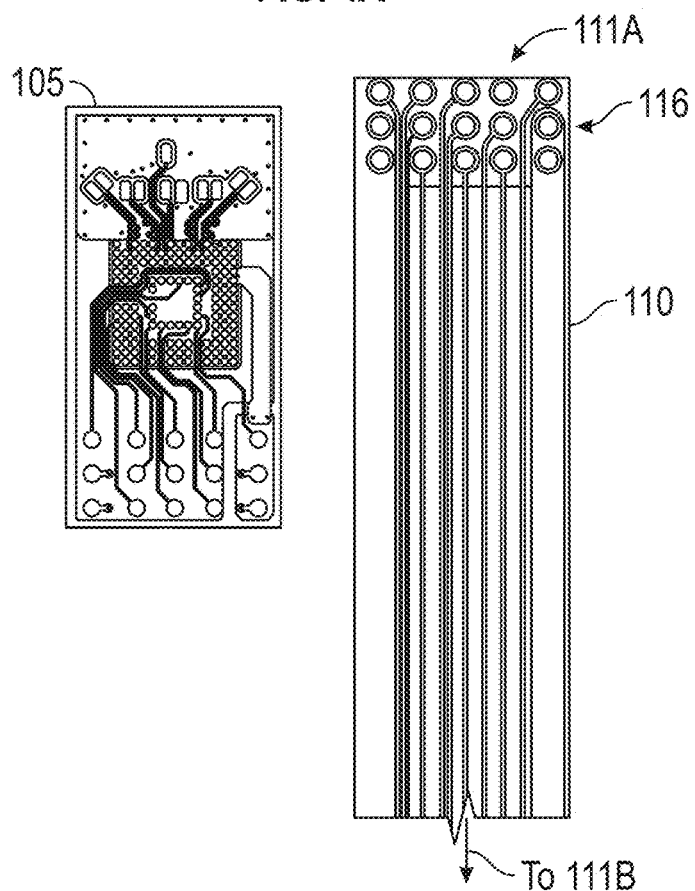
FIG. 4B illustrates two portions of a single flexible PCB circuit after it has been cut into two portions.

FIG. 4B illustrates the two portions of the unitary PCB 100 after it has been cut into two portions: a main board 105 and a flexible PCB 110. It is to be understood that the portion of the unitary PCB referred to herein as the flexible PCB 110 may entirely flexible, or it may be a rigid-flex PCB. Likewise, the main board 105 may be entirely flexible, or it may be a rigid-flex PCB. Taking the socket/adapter approach as a reference, the main board 105 replaces the external socket and dedicated pads for signal integrity testing. The flexible PCB 110 includes wires and connectors that can be soldered to the main board 105. For example, the flexible PCB 110 can be soldered to the main board 105 after the main board 105 has been soldered to the product PCB (which may also be referred to as the platform PCB or platform board).

The flexible PCB 110 has a first end 111A that is configured to be soldered to the main board 105. The first end 111A may include, for example, a plurality of through holes in a pattern that matches a corresponding pattern of connection points on the main board 105. The flexible PCB 110 also has a second end 111B, which is configured to be connected to, e.g., a piece or multiple pieces of test equipment. The second end 111B of the flexible PCB 110 may include, for example, one or more standardized connectors or features that allow standardized connectors to be attached to the flexible PCB 110.

In some embodiments, the main board 105 has small dimensions to cancel the lever of the flexible PCB 110. Therefore, the soldering becomes more reliable with no cold soldering balls. In some embodiments, the flexible PCB 110 includes through-holes that can be easily soldered to the pads of the main board 105, e.g., after the main board 105 is in place on the product PCB.

Figure 5:
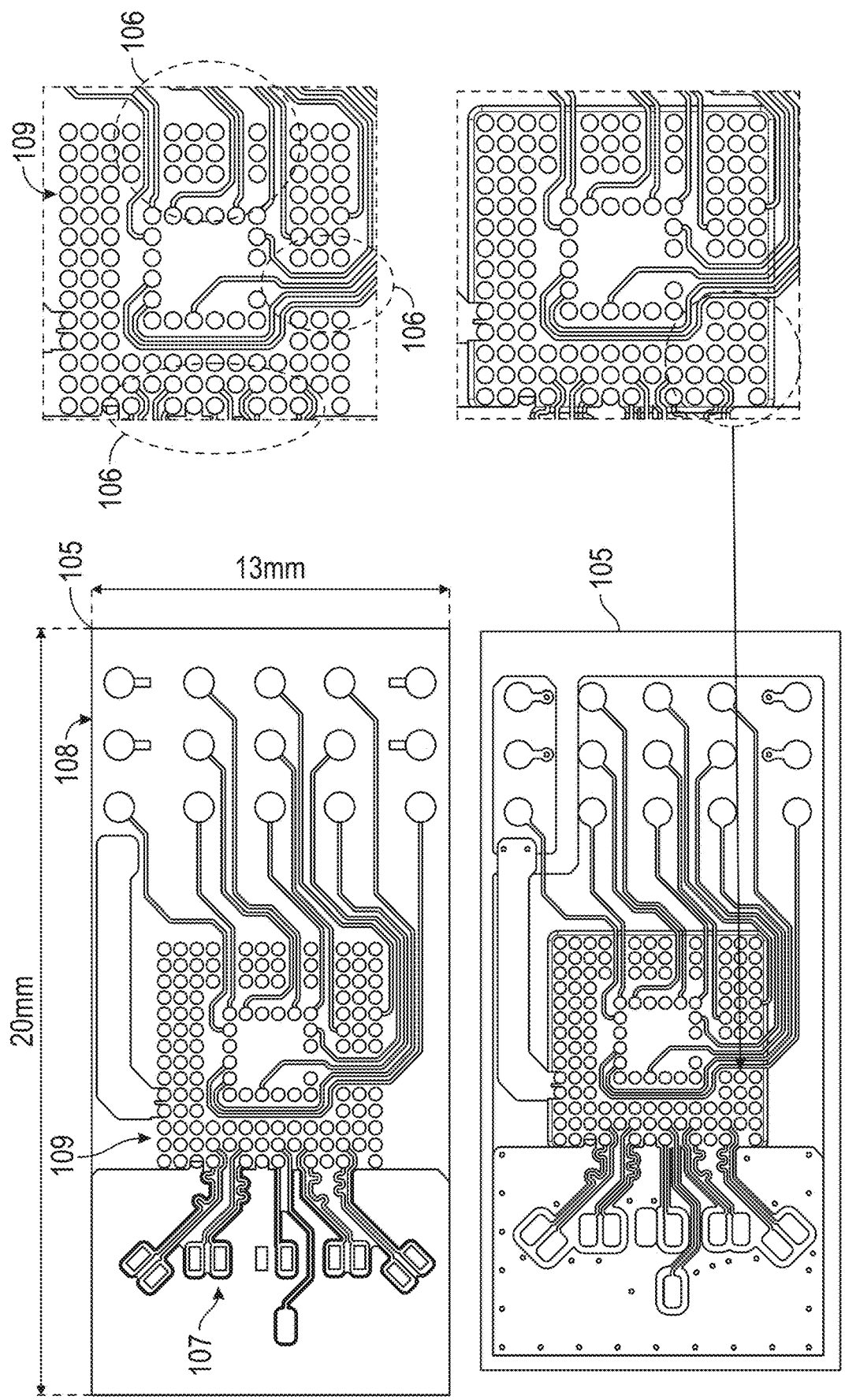
FIG. 5 illustrates an example of the main board portion of a single flexible PCB circuit in accordance with some embodiments.

FIG. 5 illustrates an example of the main board 105 in accordance with some embodiments. The main board 105 may have any suitable dimensions and layout, which, as will be appreciated by those having ordinary skill in the art, will depend on the IC 50 to be tested. For example, as shown in FIG. 5, the main board 105 may be approximately 20 mm by approximately 13 mm for some applications (e.g., to test an example iNAND UFS/eMMC chip).

The example main board 105 shown in FIG. 5 includes a plurality of contact points 109 corresponding to pins of the IC 50 to be tested. For example, the contact points 109 may be in a pattern that matches a BGA of the IC 50. The example main board 105 of FIG. 5 also includes thin wires, referred to herein as one or more transfer lines 106, that, when the IC 50 has been attached to the main board 105, connect to specific balls of the IC 50. In the example shown in FIG. 5, some of the one or more transfer lines 106 are connected to a first set of pads 107 that allow external equipment to be connected directly to the main board 105, and some of the one or more transfer lines 106 are connected to a second set of pads 108 that are configured to be soldered to the flexible PCB 110 to allow access to the IC 50 under test via one or more connectors of the flexible PCB 110. As shown in FIG. 5, unused pins (balls) can be used for one or more transfer lines 106 from the IC 50. For example, the main board 105 may include a plurality of pads (e.g., pads 107 and/or pads 108), some (or all) of which are coupled to one or more transfer lines 106 for transferring signals to and/or from the IC 50.

Figure 6C:
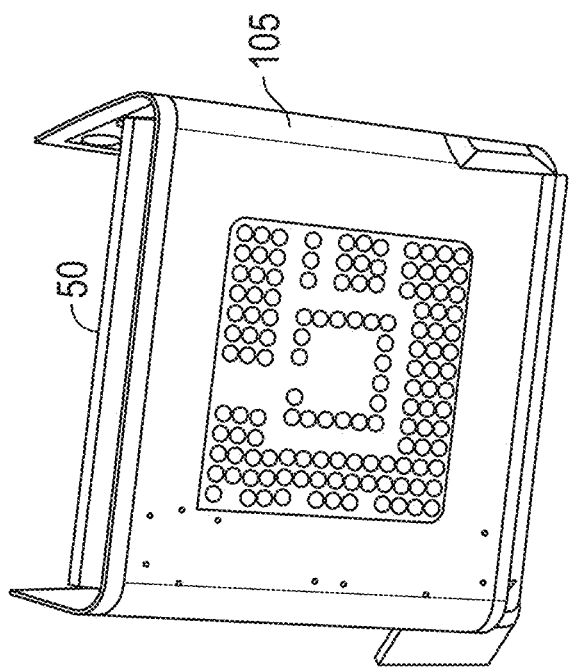
FIG. 6C shows an example main board re-balled together with an example IC in accordance with some embodiments.
Figure 6A:
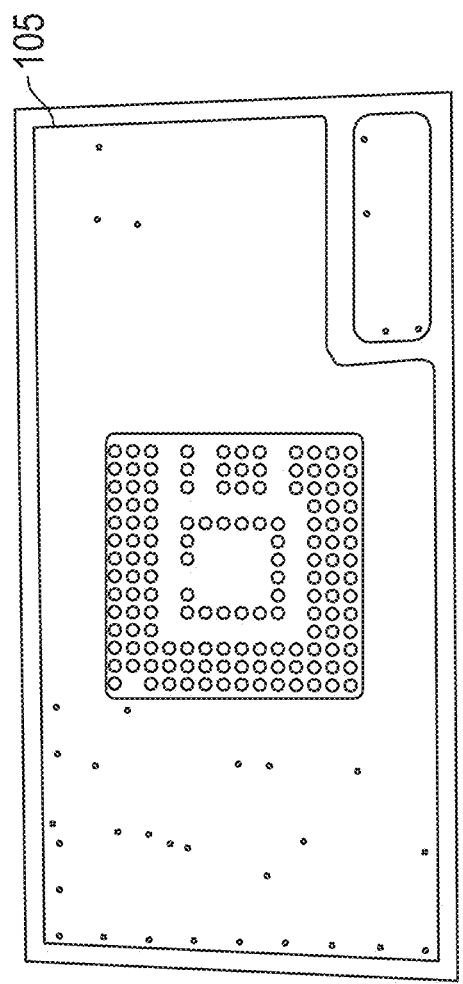
FIG. 6A illustrates the example main board of FIG. 5 after it has been re-balled with an example IC in accordance with some embodiments.
Figure 6B:
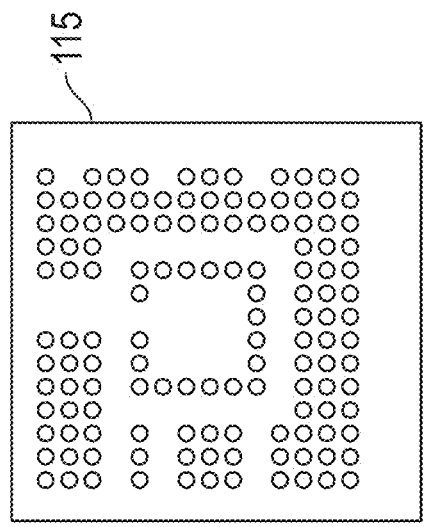
FIG. 6B shows an example of a dedicated mask in accordance with some embodiments.

FIG. 6A illustrates the example main board 105 of FIG. 5 with an example IC 50 to be tested after the IC 50 has been re-balled (e.g., the balls have been reattached) in accordance with some embodiments. As will be appreciated by those having ordinary skill in the art, re-balling is the process of putting pins on the BGA via soldering. The re-balling can be accomplished using, for example, a dedicated mask (which may also be referred to as a stencil) to simplify the placement while the BGA is being re-balled. As will be appreciated by those having ordinary skill in the art, a mask may be a plate (e.g., metal) with small holes of a size corresponding to the diameter of the BGA solder balls and a layout corresponding to the spacing between pins of the IC 50. FIG. 6B shows an example of a dedicated mask 115 that can be used for re-balling in accordance with some embodiments.

Once it has been re-balled, the IC 50 can be connected to the main board 105 (e.g., via corresponding pads of the main board 105, which are configured to be coupled to the IC 50). FIG. 6C shows the main board 105 re-balled together with an example IC 50 in accordance with some embodiments. In the example of FIG. 6C, the IC 50 is an iNAND chip, but it is to be appreciated that the disclosures herein can be used to test other types of ICs. The edges of the main board 105, which is at least partially flexible, are shown folded in FIG. 6C, which allows easy soldering to the product PCB without affecting other components on the product PCB.

Figure 7:
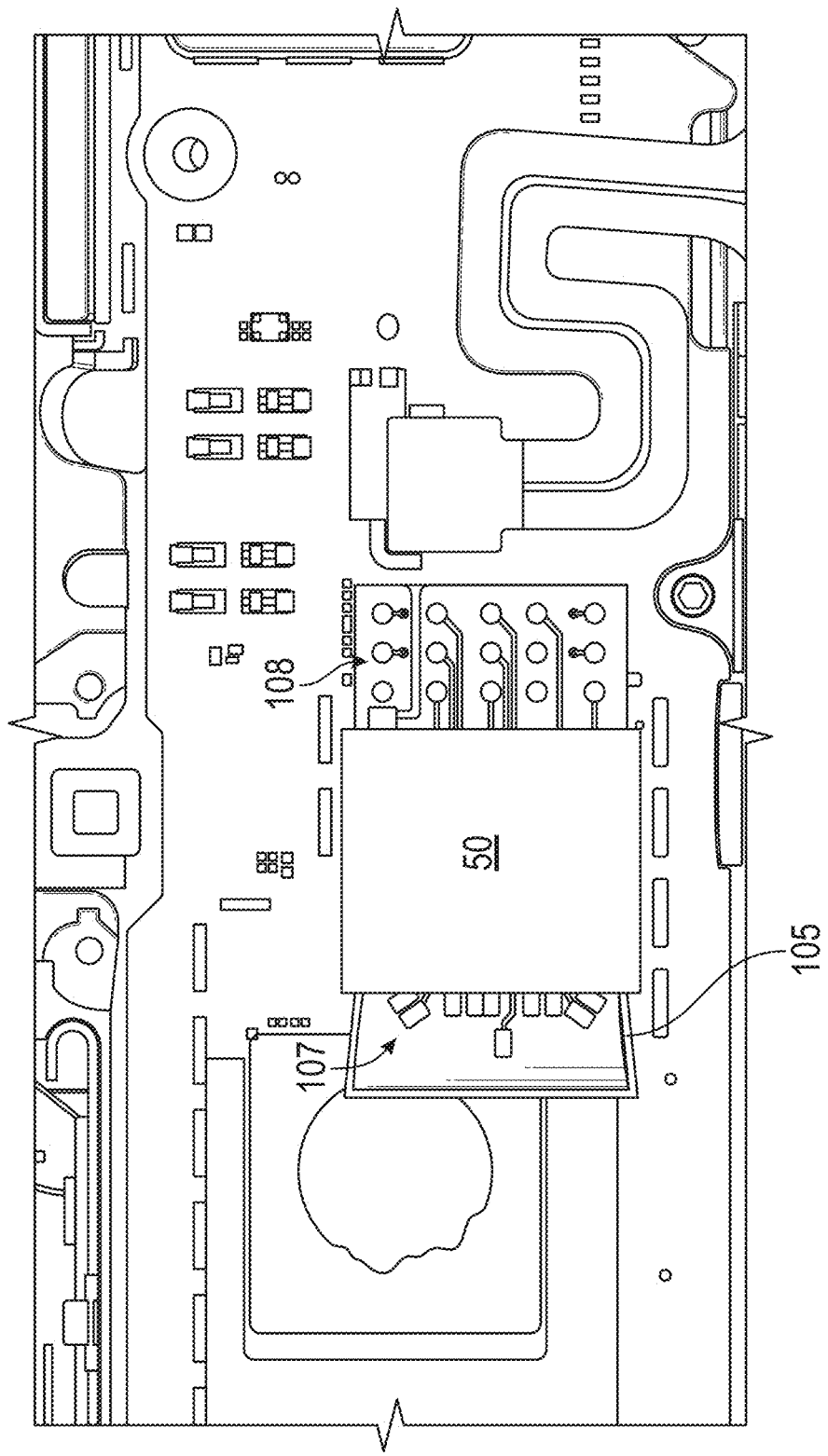
FIG. 7 illustrates a product PCB with the main board and IC attached in accordance with some embodiments.

As will be appreciated, the main board 105 and IC 50 (e.g., as shown in FIG. 6C) can be attached to the product PCB in only one cycle of soldering. FIG. 7 illustrates a product PCB with the main board 105 and IC 50 attached in accordance with some embodiments. As a result of the use of the main board 105, as opposed to, for example, an adapter or socket, there is a negligible increase in the height of the component (the IC 50). Furthermore, signal integrity is maintained.

Figure 8A:
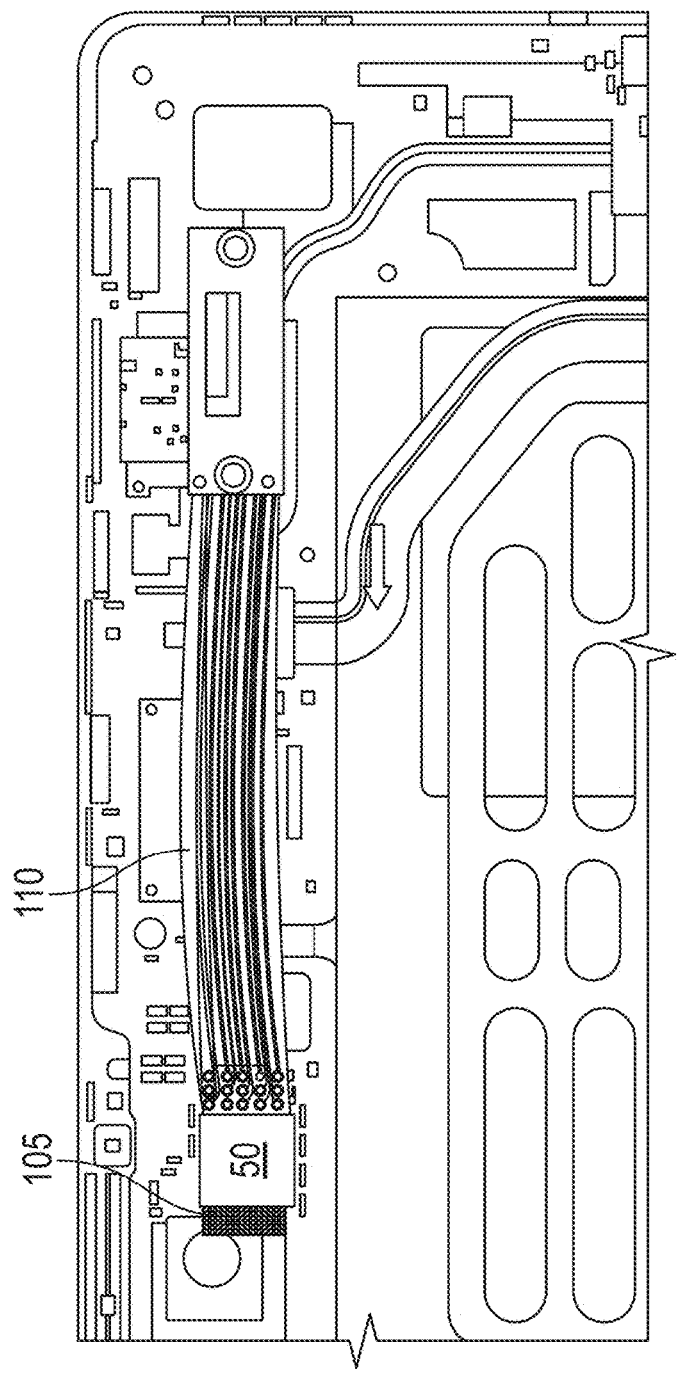
FIG. 8A illustrates an example main board and an example IC soldered to an example PCB with the flexible PCB in accordance with some embodiments.

After the main board 105 and IC 50 have been soldered to the product PCB, the flexible PCB 110 can be soldered to the pads 108 of the main board 105, which are already connected to the IC 50 under test. FIG. 8A illustrates the example main board 105 and an example IC 50 (specifically, an iNAND chip) soldered to an example cell phone PCB with the flexible PCB 110 attached to the pads 108 of the main board 105 in accordance with some embodiments. The pads 108 of the main board 105 are visible on the right-hand side of the iNAND chip in FIG. 8A. As explained above, an advantage of using the unitary PCB 100 as described herein is that the main board 105 and flexible PCB 110 may be thin (e.g., they may have a thickness of less than 0.5 mm). Therefore, the main board 105 and at least a portion of the flexible PCB 110 may add little height to the product PCB (e.g., less than 0.3 mm).

Figure 8B:
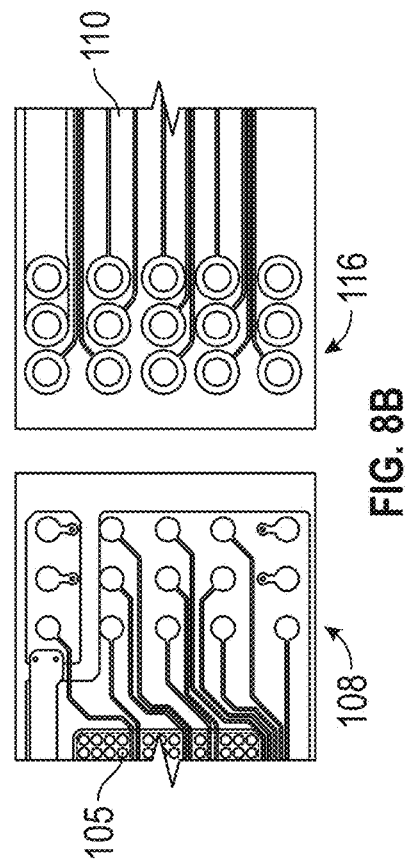
FIG. 8B is a close-up view of the pads of an example main board and the corresponding through-holes of an example flexible PCB in accordance with some embodiments.

As explained above, the main board 105 and flexible PCB 110 can be connected to each other and the flexible PCB 110 used to transfer signals to and/or from the IC 50. Specifically, the through-holes 116 of the flexible PCB 110 can be aligned with the pads 108 of the main board 105 and soldered together. As a result, the main board 105 and flexible PCB 110 can be connected together quickly, without the need of a connector, using surface mount technology (SMT) to connect the pads 108 to the VSF connector 114 provided in the unitary PCB 100, as shown in FIG. 8B.

Figure 9A:
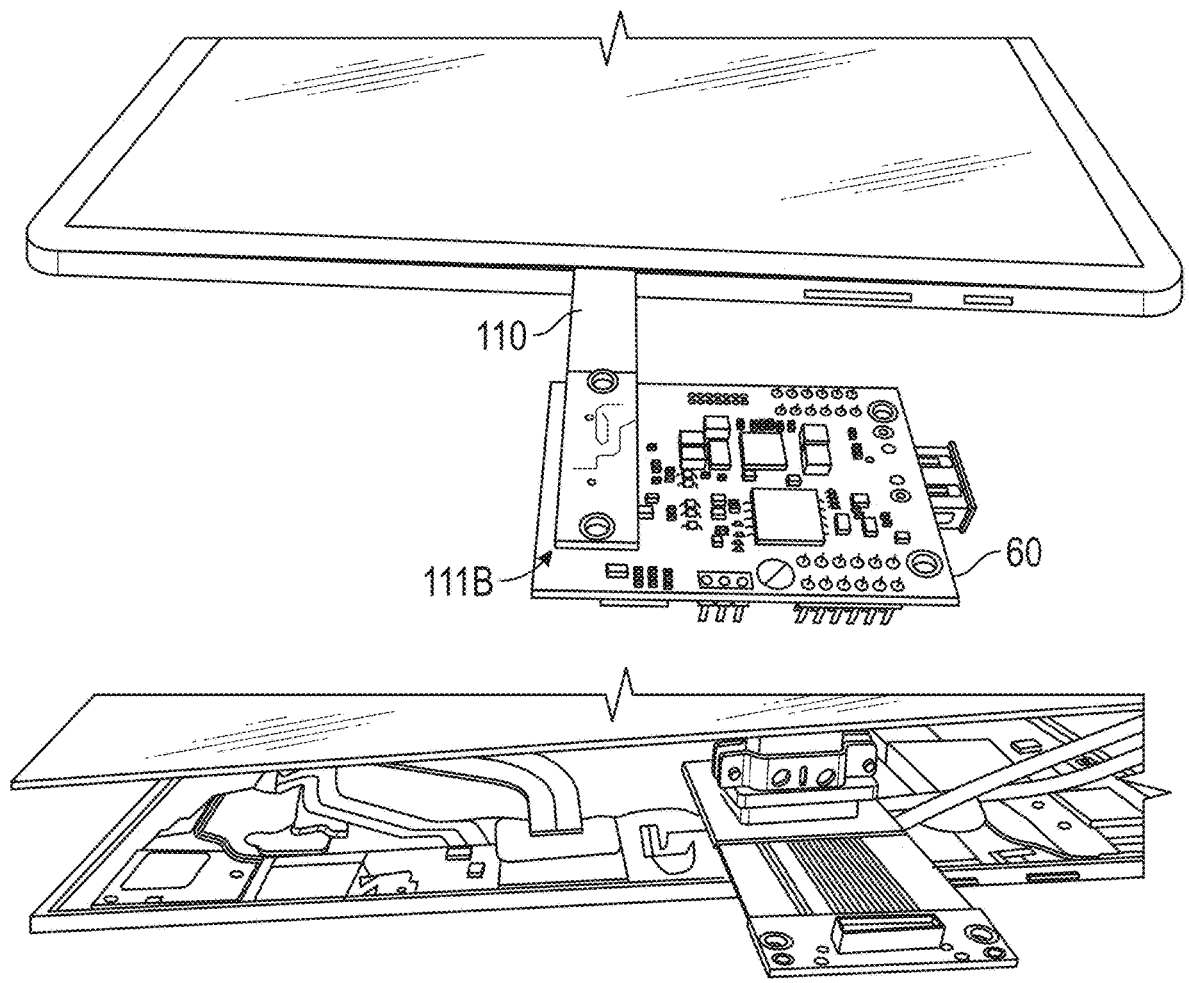
FIG. 9A shows the second end of the flexible PCB connected to an external test circuit in accordance with some embodiments.
Figure 9B:
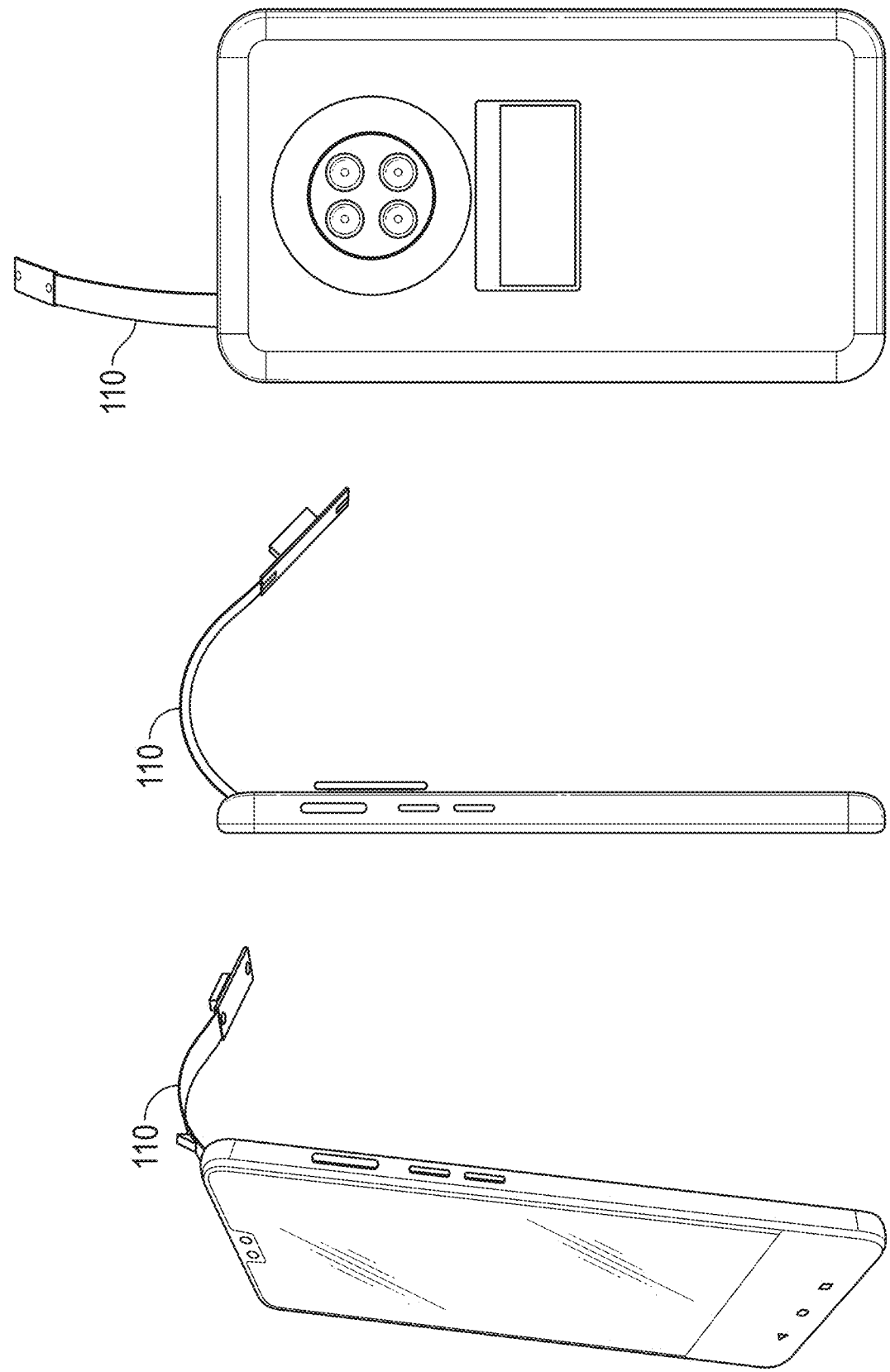
FIG. 9B illustrates an example cell phone platform in the closed position to allow tests to be performed in the field environment in accordance with some embodiments.

In some embodiments, a test system for devices is provided that allows an IC 50 to be tested in its native environment under ordinary use conditions using the unitary PCB 100 (e.g., after splitting it into two portions, namely a main board 105 and a flexible PCB 110). For example, a test system can use the main board 105 and flexible PCB 110 for iNAND chips on host platforms and inside a host cell phone original case. FIG. 9A shows the second end 111B of the flexible PCB 110 connected to an external test circuit 60 in accordance with some embodiments. FIG. 9B illustrates an example cell phone platform in the closed position to allow tests to be performed in the field environment in accordance with some embodiments. Note that, in the example shown in FIG. 9B, the cell phone platform can be closed, and the tests can be performed on the cell phone platform in the field environment, which will produce a test environment that is almost identical to the true conditions in the field. Thus, using the unitary PCB 100 (e.g., after it has been split into the main board 105 and the flexible PCB 110), an IC 50 in a product can be tested as it operates in the field, giving access to data such as temperature.

Figure 10B:
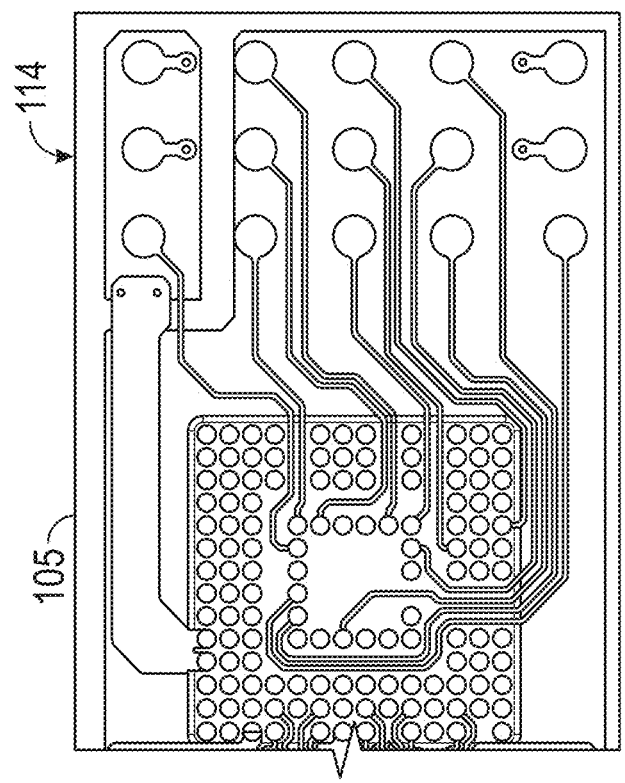
FIG. 10B shows a main board that includes an example VSF connector in accordance with some embodiments.
Figure 10A:
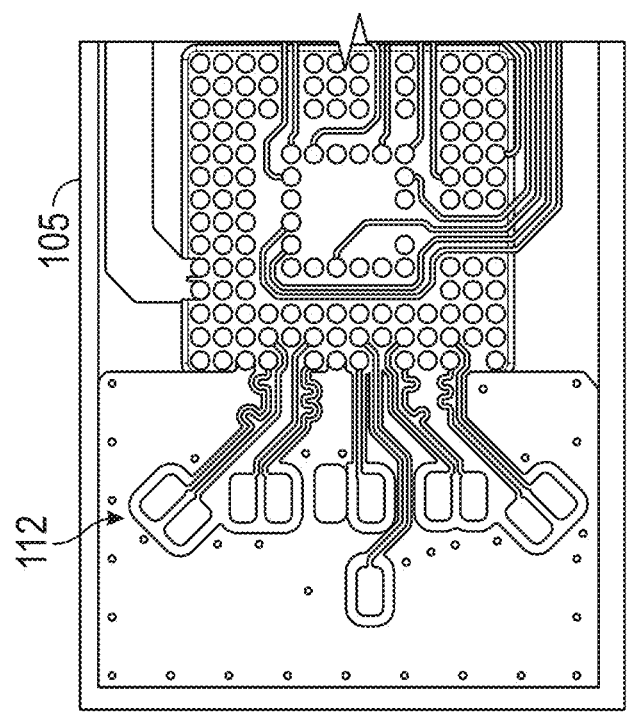
FIG. 10A shows a main board that includes an example universal flash storage (UFS) connector in accordance with some embodiments.

The main board 105 can also, or alternatively, have any suitable connector or pads 107 to allow equipment (e.g., external test equipment) to be coupled to the main board 105 to probe the attached IC 50. FIGS. 10A and 10B illustrate two example connectors in accordance with some embodiments. FIG. 10A shows an example universal flash storage (UFS) connector 112 in accordance with some embodiments. The UFS connector 112 may allow the main board 105 to be, for example, connected to a UFS analyzer device. As will be appreciated, a UFS analyzer may be capable of testing MIPI M-PHY signals. In some embodiments, the UFS connector 112 has pairs of pads that can be connected by the main board 105 to the balls of the IC under test such that a high-frequency differential signal may be retrieved and/or recorded by an external logic analyzer. The differential lines may be designed to have a specific impedance and may also be close to the component (the IC 50 under test). The UFS connector 112 may be suitable for use with logic analyzers and similar equipment.

FIG. 10B shows a main board that includes an example VSF connector 114 in accordance with some embodiments. The VSF connector 114 may allow the main board 105 to be connected to VSF devices (and, for example, the flexible PCB 110 via the through-holes 116).

Figure 11:
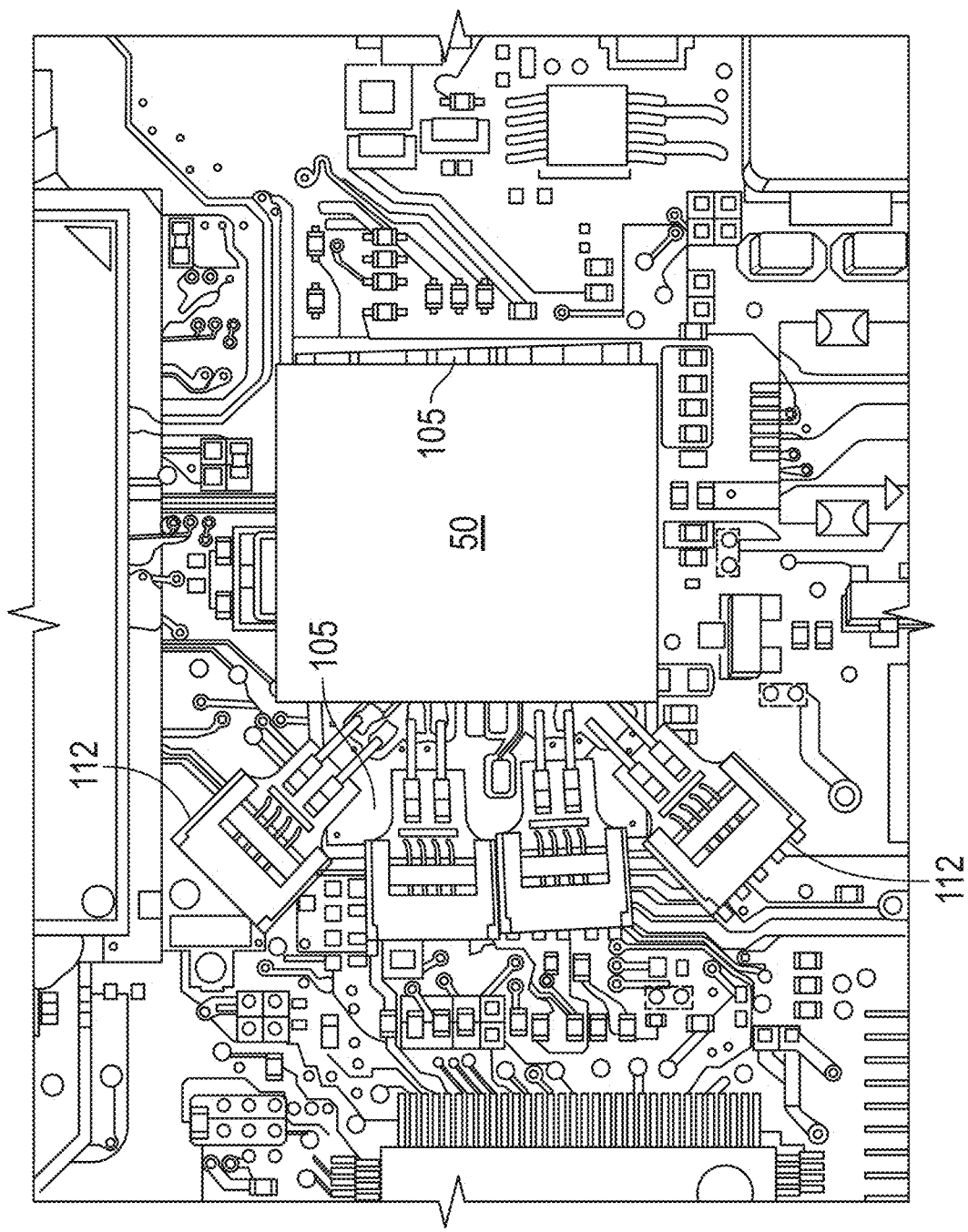
FIG. 11 shows an example of a product PCB with a main board with the UFS connector of FIG. 10A and an IC under test in accordance with some embodiments.

FIG. 11 shows an example of a product PCB with a main board 105 with the UFS connector 112 of FIG. 10A and an IC 50 under test in accordance with some embodiments. Because the wires to the UFS connector 112 are the same length, signal integrity is improved relative to other approaches.

Figure 12A:
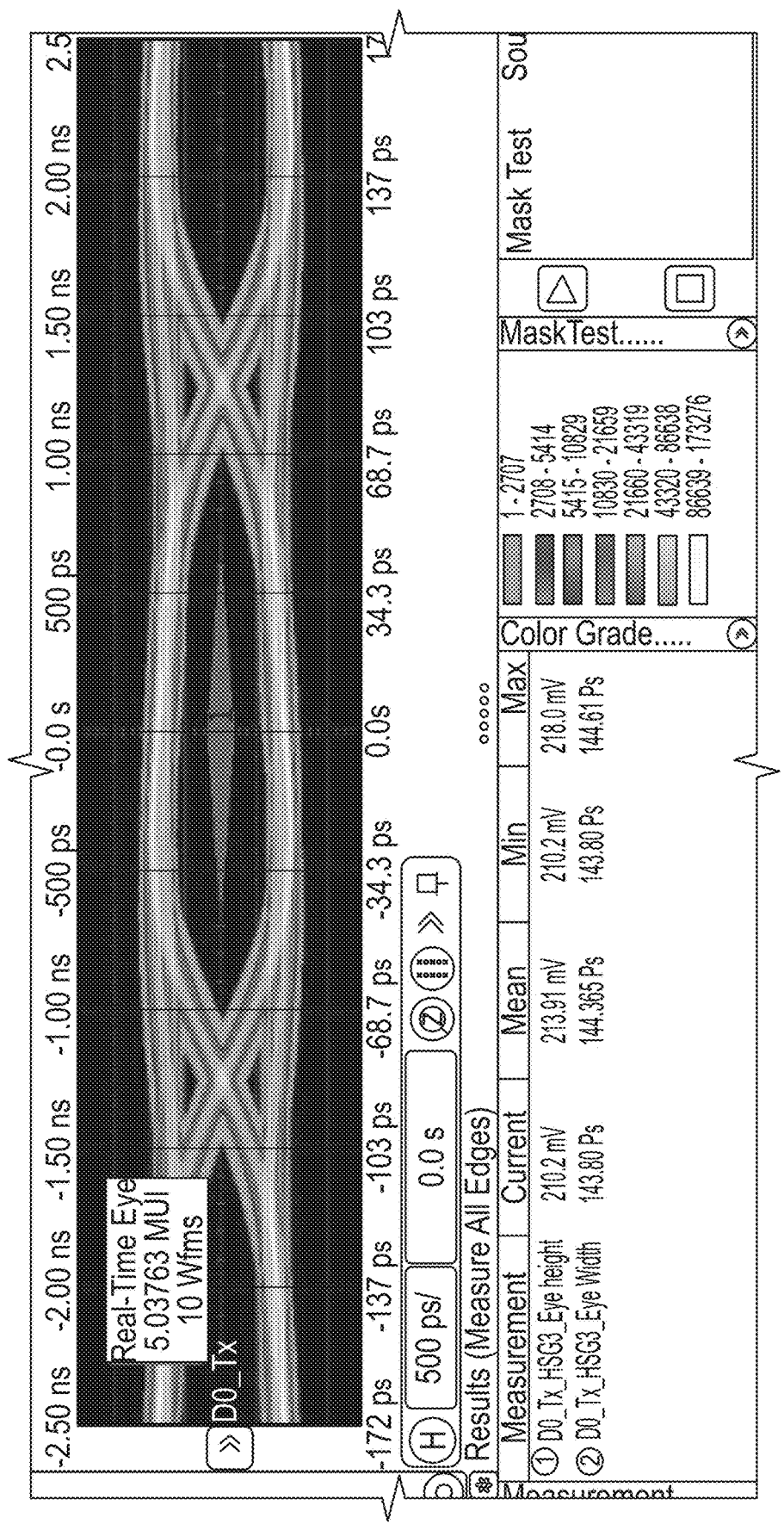
FIGS. 12A and 12B show an example of SI testing done using an example of the main board in accordance with some embodiments.
Figure 12B:
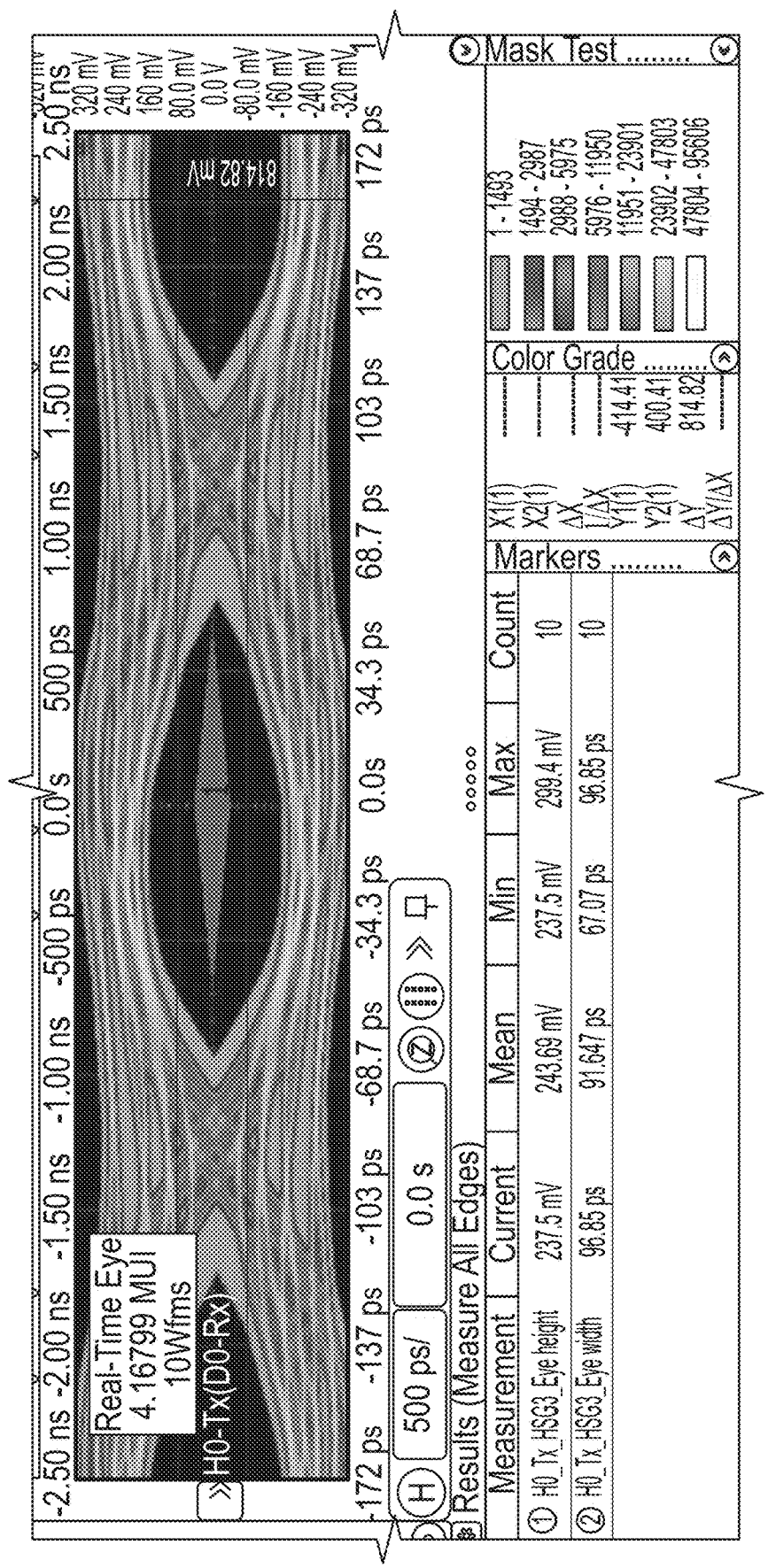

FIGS. 12A and 12B show an example of SI testing done using an example of the main board 105 in accordance with some embodiments. FIG. 12A illustrates the results of transmission from the host to the device (the IC 50 under test), and FIG. 12B shows the results of transmission from the device to the host. Because of the use of the main board 105, the SI measurement can be done very close to the device (the IC 50 under test), thereby providing insight into the signals seen by the device.

Figure 13:
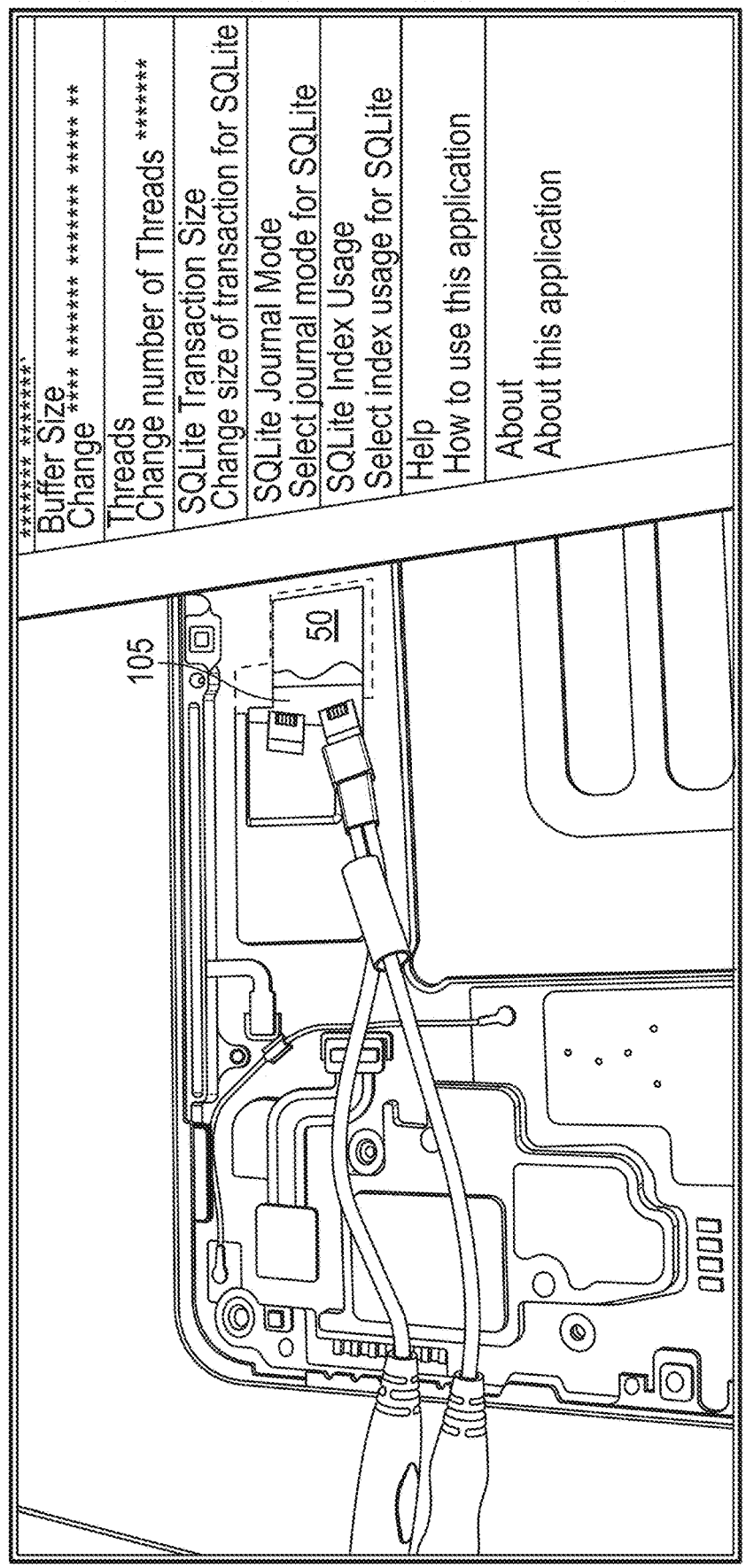
FIG. 13 illustrates an example use case in which scope probes are connected directly to the main board in accordance with some embodiments.

FIG. 13 illustrates an example use case in which scope probes are connected directly to the main board 105 while the product platform keeps the same form factor in accordance with some embodiments. Thus, some embodiments provide for SI testing while connected directly to the platform PCB, thereby improving accuracy and reliability of SI measurements. Furthermore, the UFS connector 112 can be integrated into logic analyzer products to allow testing of ICs while connected directly to the original platform's PCB.

Figure 14:
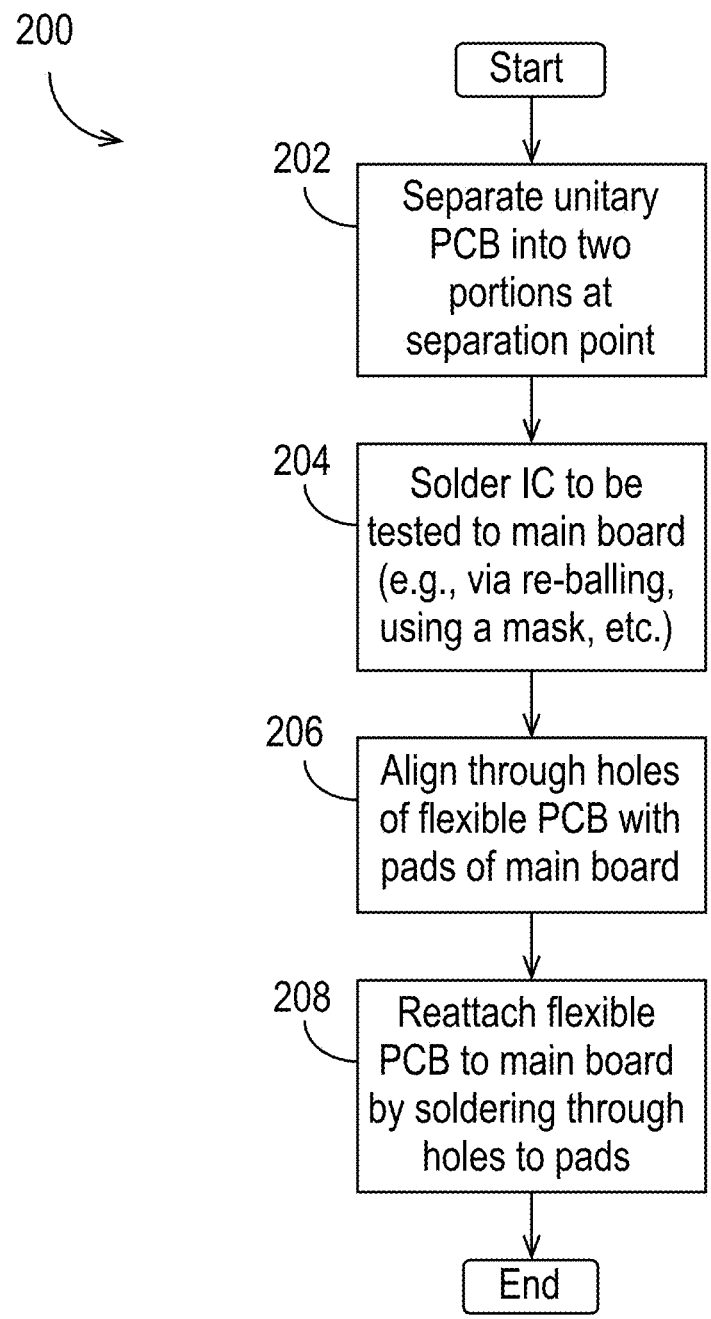
FIG. 14 is a flow diagram illustrating an example method of using a unitary PCB to test an IC of a device in accordance with some embodiments.

FIG. 14 is a flow diagram illustrating a method 200 of using the unitary PCB 100 to test an IC 50 of a device in accordance with some embodiments. At block 202, the unitary PCB 100 is separated into two portions at a separation point 102. The separation point 102 may be, e.g., marked on the unitary PCB 100 during or after the manufacturing process, or its location may be determined by the person or entity separating the unitary PCB 100 into two portions. One portions resulting from the separation is the main board 105, and the other is the flexible PCB 110. The main board 105 may have, for example, a plurality of pads (e.g., pads 107, pads 108) allowing the IC 50 under test to be monitored and/or to allow communication with the IC 50 under test. The flexible PCB 110 may have, for example, through-holes 116 allowing it to be connected to the main board 105 (e.g., via pads 108). At block 204, the IC 50 to be tested is soldered to the main board 105 (e.g., as described above in the discussion of FIGS. 6A, 6B, and 6C). At block 206, the through-holes 116 of the flexible PCB 110 are aligned with a plurality of pads (e.g., pads 108) on the main board 105. At block 208, the flexible PCB 110 is reattached to the main board 105 by soldering at least a portion of the through-holes 116 of the flexible PCB 110 to a corresponding at least a portion of the plurality of pads (e.g., pads 108) on the main board 105.

Figure 15:
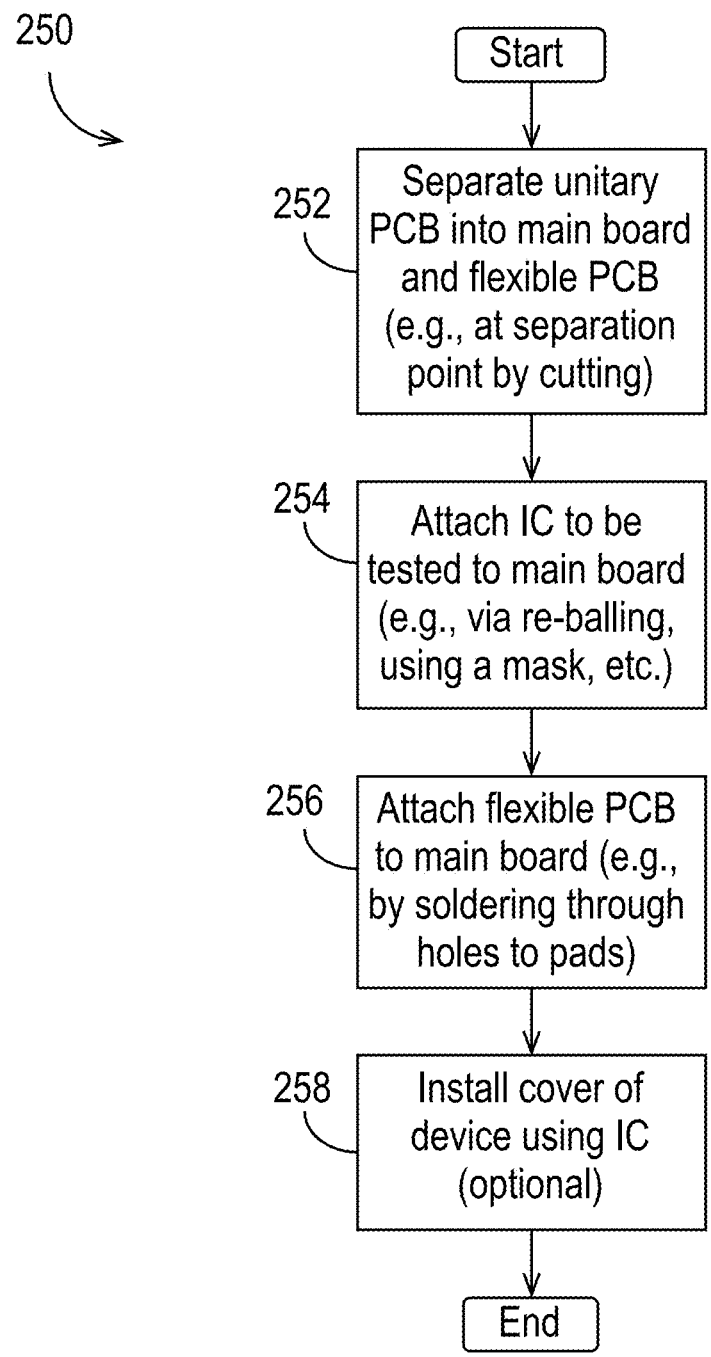
FIG. 15 is another flow diagram illustrating another example method of using a unitary PCB to test an IC of a device in accordance with some embodiments.

FIG. 15 is a flow diagram illustrating a method 250 of using the unitary PCB 100 to test an IC 50 of a device in accordance with some embodiments. At block 252, the unitary PCB 100 is separated into two portions: the main board 105 and the flexible PCB 110. For example, the unitary PCB 100 may be separated by cutting it, for example, at a separation point 102 identified by a marking (e.g., a line, etc.) or at an appropriate location that can be inferred by inspection of the unitary PCB 100. At block 254, the IC 50 to be tested (e.g., in a BGA package) is attached to the main board 105 (e.g., via soldering and/or re-balling, potentially using a mask/stencil as described above in the discussion of FIGS. 6A, 6B, and 6C). At block 256, the flexible PCB 110 is attached to the main board 105. In some embodiments, the flexible PCB 110 is reattached to the main board 105 by soldering a plurality of through-holes 116 of the flexible PCB 110 to a corresponding plurality of pads 108 on the main board 105. (The pads 108 may comprise a VSF connector 114.) Optionally, at block 258, a cover of the device in which the IC 50 is used is installed after completing block 252, block 254, and block 256. The result of (optional) block 258 is to enclose the main board 105 and at least a portion of the flexible PCB 110 within the device that includes the IC 50 under test.

In the foregoing description and in the accompanying drawings, specific terminology has been set forth to provide a thorough understanding of the disclosed embodiments. In some instances, the terminology or drawings may imply specific details that are not required to practice the invention.

To avoid obscuring the present disclosure unnecessarily, well-known components are shown in block diagram form and/or are not discussed in detail or, in some cases, at all.

Unless otherwise specifically defined herein, all terms are to be given their broadest possible interpretation, including meanings implied from the specification and drawings and meanings understood by those skilled in the art and/or as defined in dictionaries, treatises, etc. As set forth explicitly herein, some terms may not comport with their ordinary or customary meanings.

As used in the specification and the appended claims, the singular forms "a," "an" and "the" do not exclude plural referents unless otherwise specified. The word "or" is to be interpreted as inclusive unless otherwise specified. Thus, the phrase "A or B" is to be interpreted as meaning all of the following: "both A and B," "A but not B," and "B but not A." Any use of "and/or" herein does not mean that the word "or" alone connotes exclusivity.

As used in the specification and the appended claims, phrases of the form "at least one of A, B, and C," "at least one of A, B, or C," "one or more of A, B, or C," and "one or more of A, B, and C" are interchangeable, and each encompasses all of the following meanings: "A only," "B only," "C only," "A and B but not C," "A and C but not B," "B and C but not A," and "all of A, B, and C."

To the extent that the terms "include(s)," "having," "has," "with," and variants thereof are used in the detailed description or the claims, such terms are intended to be inclusive in a manner similar to the term "comprising," i.e., meaning "including but not limited to."

The terms "exemplary" and "embodiment" are used to express examples, not preferences or requirements.

The term "coupled" is used herein to express a direct connection/attachment as well as a connection/attachment through one or more intervening elements or structures.

The terms "over," "under," "between," and "on" are used herein refer to a relative position of one feature with respect to other features. For example, one feature disposed "over" or "under" another feature may be directly in contact with the other feature or may have intervening material. Moreover, one feature disposed "between" two features may be directly in contact with the two features or may have one or more intervening features or materials. In contrast, a first feature "on" a second feature is in contact with that second feature.

The term "substantially" is used to describe a structure, configuration, dimension, etc. that is largely or nearly as stated, but, due to manufacturing tolerances and the like, may in practice result in a situation in which the structure, configuration, dimension, etc. is not always or necessarily precisely as stated. For example, describing two lengths as "substantially equal" means that the two lengths are the same for all practical purposes, but they may not (and need not) be precisely equal at sufficiently small scales. As another example, a structure that is "substantially vertical" would be considered to be vertical for all practical purposes, even if it is not precisely at 90 degrees relative to horizontal.

The drawings are not necessarily to scale, and the dimensions, shapes, and sizes of the features may differ substantially from how they are depicted in the drawings.

Although specific embodiments have been disclosed, it will be evident that various modifications and changes may be made thereto without departing from the broader spirit and scope of the disclosure. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

The invention claimed is:

1. A unitary printed circuit board (PCB) for testing an integrated circuit (IC), the unitary PCB comprising:
   a main board portion on a first side of a separation line, the main board comprising a first plurality of pads; and
   a flexible PCB portion on a second side of the separation line, the flexible PCB portion comprising:
       a plurality of through-holes disposed on a first end of the flexible PCB portion; and
       a plurality of connectors disposed on a second end of the flexible PCB portion, the plurality of connectors configured to connect the flexible PCB portion to an external test circuit, wherein:
       the main board portion and the flexible PCB portion are configured to be detached from each other at the separation line,
       a layout of the plurality of through-holes of the flexible PCB portion to matches a layout of the first plurality of pads of the main board portion, wherein the plurality of through-holes are configured to be aligned and soldered to the first plurality of pads.

2. The unitary PCB recited in claim 1, wherein the main board portion further comprises a plurality of contact points, wherein a layout of the plurality of contact points matches a layout of a plurality of pins of the IC, and the plurality of contact points of the main board portion are configured to be coupled to the plurality of pins of the IC.

3. The unitary PCB recited in claim 2, wherein the main board portion further comprises a plurality of transfer lines, and wherein at least subset of the plurality of contact points is coupled to the plurality of transfer lines for transferring signals from the IC.

4. The unitary PCB recited in claim 2, wherein the soldering of the plurality of through-holes to the first plurality of pads is configured to connect the IC to an external test circuit.

5. The unitary PCB recited in claim 1, wherein a thickness of the main board portion is less than approximately 0.5 mm.

6. The unitary PCB recited in claim 1, wherein the main board portion further comprises a plurality of contact points, wherein a layout of the plurality of contact points matches a layout of a ball grid array of the IC, and the plurality of contact points are configured to be soldered in one operation in parallel to the ball grid array of the IC.

7. The unitary PCB recited in claim 1, wherein the main board portion further comprises a second plurality of pads configured to connect the IC to an external test circuit.

8. The unitary PCB recited in claim 1, wherein the main board portion comprises a universal flash storage (UFS) connector and/or a VSF connector.

9. The unitary PCB recited in claim 1, wherein a size of the main board portion is approximately 20 mm by approximately 13 mm.

10. A method of using the unitary PCB recited in claim 2, the method comprising:
- separating the main board portion from the flexible PCB portion at the separation line;
- soldering at least a portion of the plurality of pins of the IC to at least a portion of the plurality of contact points;
- aligning the through-holes of the flexible PCB portion with the first plurality of pads of the main board portion; and
- reattaching the flexible PCB portion to the main board portion by soldering at least a portion of the through-holes of the flexible PCB portion to a corresponding at least a portion of the first plurality of pads.

11. A method of using the unitary PCB recited in claim 1, the method comprising:
- separating the main board portion from the flexible PCB portion at the separation line;
- soldering the IC to the main board portion;
- aligning the through-holes of the flexible PCB portion with the first plurality of pads of the main board portion; and
- reattaching the flexible PCB portion to the main board portion by soldering at least a portion of the through-holes of the flexible PCB portion to a corresponding at least a portion of the first plurality of pads.

* * * * *